United States Patent
Fan et al.

(10) Patent No.: US 9,508,506 B2
(45) Date of Patent: Nov. 29, 2016

(54) POTTING METHOD FOR LAMP CHAIN

(75) Inventors: Huajian Fan, Shenzhen (CN); Shuai Li, Shenzhen (CN); Hui Wu, Shenzhen (CN); Zesheng Ye, Shenzhen (CN)

(73) Assignee: OSRAM GMBH, Munich (DE)

( * ) Notice: Subject to any disclaimer, the term of this patent is extended or adjusted under 35 U.S.C. 154(b) by 652 days.

(21) Appl. No.: 13/976,066

(22) PCT Filed: Dec. 13, 2011

(86) PCT No.: PCT/EP2011/072578
§ 371 (c)(1),
(2), (4) Date: Jun. 26, 2013

(87) PCT Pub. No.: WO2012/089494
PCT Pub. Date: Jul. 5, 2012

(65) Prior Publication Data
US 2014/0191440 A1    Jul. 10, 2014

(30) Foreign Application Priority Data
Dec. 30, 2010    (CN) .......................... 2010 1 0616336

(51) Int. Cl.
| | | |
|---|---|---|
| H01H 17/08 | (2006.01) | |
| B29C 41/20 | (2006.01) | |
| H05K 3/28 | (2006.01) | |
| H05K 1/03 | (2006.01) | |

(52) U.S. Cl.
CPC .............. *H01H 17/08* (2013.01); *B29C 41/20* (2013.01); *F21S 4/10* (2016.01); *H05K 3/284* (2013.01); *H05K 1/0393* (2013.01); *H05K 2201/10106* (2013.01); *H05K 2203/1322* (2013.01)

(58) Field of Classification Search
CPC .................. B29C 41/20; H05K 3/284; H05K 2203/1322; H05K 2201/10106; H05K 1/393; F21S 4/001

USPC .................................................... 264/272.15
See application file for complete search history.

(56) References Cited

U.S. PATENT DOCUMENTS

| | | | | |
|---|---|---|---|---|
| 4,305,796 A | * | 12/1981 | Gagliani | ............ C08G 73/1025 264/420 |
| 4,761,720 A | | 8/1988 | Solow | |
| 5,525,644 A | * | 6/1996 | Artus | ..................... H01B 3/306 174/110 F |
| 5,931,577 A | | 8/1999 | Ishibashi | |
| 8,119,050 B2 | * | 2/2012 | Kuratomi | ................ B29C 70/84 264/272.11 |

(Continued)

FOREIGN PATENT DOCUMENTS

| | | |
|---|---|---|
| CN | 101504938 A | 8/2009 |
| WO | 2006093889 A2 | 9/2006 |

OTHER PUBLICATIONS

Chinese Office Action received for the parallel Chinese Application No. 201010616336.2 dated Nov. 4, 2011 including the English translation.

*Primary Examiner* — Joseph S. Del Sole
*Assistant Examiner* — Nahida Sultana
(74) *Attorney, Agent, or Firm* — Viering, Jentschura & Partner mbB

(57) ABSTRACT

A potting method for a lamp chain includes a) providing a mold having a potting groove; b) providing a fixing support which is fixedly kept in the potting groove; c) fixedly keeping a printed circuit board provided with a light emitting assembly in the fixed support; d) potting a potting material into the potting groove and curing the potting material; and e) removing the mold.

12 Claims, 3 Drawing Sheets

(56) References Cited

U.S. PATENT DOCUMENTS

| | | | |
|---|---|---|---|
| 2003/0049413 A1 | 3/2003 | Packer et al. | |
| 2006/0110859 A1* | 5/2006 | Shigemura | H01L 23/3121 438/125 |
| 2009/0114937 A1* | 5/2009 | Kawakubo | B29C 43/18 257/98 |
| 2009/0274188 A1* | 11/2009 | Jang | H01L 33/44 372/50.1 |
| 2010/0025847 A1* | 2/2010 | Tomura | H01L 21/563 257/737 |
| 2010/0084167 A1* | 4/2010 | Shim | H05K 1/0326 174/252 |
| 2010/0109037 A1* | 5/2010 | Sakurai | H01L 33/504 257/98 |
| 2010/0112734 A1* | 5/2010 | Koizumi | B29C 41/045 438/27 |
| 2011/0261543 A1* | 10/2011 | Xu | B29C 45/14065 361/752 |
| 2012/0007076 A1* | 1/2012 | Cho | F21S 48/115 257/48 |

* cited by examiner

POTTING METHOD FOR LAMP CHAIN

RELATED APPLICATIONS

The present application is a national stage entry according to 35 U.S.C. §371 of PCT application No.: PCT/EP2011/072578 filed on Dec. 13, 2011, which claims priority from Chinese application No.: 20 1010 616 336.2 filed on Dec. 30, 2010.

TECHNICAL FIELD

Various embodiments relate to a potting method for a lamp chain.

BACKGROUND

Flexible lamp chains are usually widely used in outdoor environments, such as building contour illumination and cove lighting. Generally this type of lamp chains is slim and flexible and then can be simply bent to any shape, and this type of lamp chains also meets IP65 requirement or higher IP levels for outdoor use. Actually, the structure of a flexible lamp chain is very simple. A flexible PCB is embedded into a flexible and transparent glue. However, the difficulty of making this type of flexible lamp chain lies in a potting process.

The prior art discloses a method of making a flexible lamp chain, wherein, a potting material is directly potted in a flexible PCB board provided with an LED assembly, and the advantage lies in a simple process procedure and a low cost. However, the disadvantage is also very obvious, that is, the potting material may easily strip off the PCB board and the waterproof property is also poor. Another existing method for making the flexible lamp chain lies in placing a flexible PCB board in a receiving groove of a potting material and then potting the opening of the receiving groove. This advantage of this making method lies in a low cost, use of less potting material and waterproof property, and while the disadvantage is that the PCB board per se cannot be arranged evenly in the receiving groove, and thus the PCB board is arranged twisted in the finished flexible lamp chain and is not beautiful in appearance. The most conventional method is to directly package the PCB using a potting material, which achieves fine waterproof effect, however, this still cannot arrange the PCB board evenly in the flexible lamp chain.

SUMMARY

Hence, various embodiments provide an improved potting method for a lamp chain, and the lamp chain made using this method has a good appearance, the printed circuit board provided in the lamp chain is arranged evenly in the finished lamp chain, and also, this lamp chain has fine waterproof performance.

According to the disclosed embodiment, the potting method includes: a) providing a mold having a potting groove; b) providing a fixing support which is fixedly kept in the potting groove; c) fixedly keeping a printed circuit board provided with a light emitting assembly in the fixed support; d) potting a potting material into the potting groove and curing the potting material; and e) removing the mold. In this method, as the printed circuit board is fixedly kept in the fixing support and the fixing support is fixedly kept in the potting groove, this ensures that the printed circuit board will not be twisted in the potting groove, thereby obtaining a lamp chain with the printed circuit board evenly arranged therein after the potting.

As put forward in a preferable design according to the disclosed embodiment, in step b), the fixing support made of a flexible material is provided. Preferably, in step b), the fixing support made of a material the same with the potting material is provided. After potting the potting groove with the potting material, the fixing support is made integral with the potting material, thereby obtaining very good waterproof effect.

Preferably, in step b), the fixing support made of a material similar to the potting material is provided. This material does not have aberration with respect to the potting material and is similar to the potting material in material characteristics, and then it can be better fused with the potting material. This obviously broadens the scope of the selection of the materials for making the fixing support.

Preferably, in step b), the fixing support is clamped in the potting groove. Advantageously, the width of the fixing support is slightly larger than the width of the opening of the potting groove, so that the fixing support can be fixedly arranged in the potting groove in a manner of the interference fit.

Preferably, in step c), the printed circuit board is clamped in the fixing support. Advantageously, the width of the printed circuit board is slightly larger than the width of the opening of the fixing support, so that the printed circuit board can be fixedly arranged in the opening of the fixing support in a manner of the interference fit.

As put forward in a preferable design according to the disclosed embodiment, in step a), the mold of the potting groove having a U-shape section contour is provided; and in step b) the fixing support consisting of multiple U-shape supports spaced apart is provided. The contour of the U-shape support matches the section contour of the potting groove, and the multiple U-shape supports can satisfactorily keep the printed circuit board evenly.

Preferably, in step b), the height of the U-shape support is made to be less than or equal to the depth of the potting groove, so that, after the potting process, the U-shape support will not protrude from the surface of the lamp chain, and this will not destroy the appearance of the lamp chain.

As put forward in a preferable design according to the disclosed embodiment, in step c), the depth of the opening of the U-shape support is made to be greater than the thickness of the printed circuit board, which ensures that the potting material can completely cover the printed circuit board, thereby achieving fine waterproof performance.

Preferably, the potting material is epoxy resin, polyurethane modified epoxy resin and polyurethane resin.

BRIEF DESCRIPTION OF THE DRAWINGS

The accompanying drawings constitute a part of the description and are used to provide further understanding of the disclosure. Such accompanying drawings illustrate the embodiments of the disclosure and are used to describe the principles of the disclosure together with the description.

In the accompanying drawings the same components are represented using the same reference signs. As shown in the drawings.

DETAILED DESCRIPTION

Figure 1:
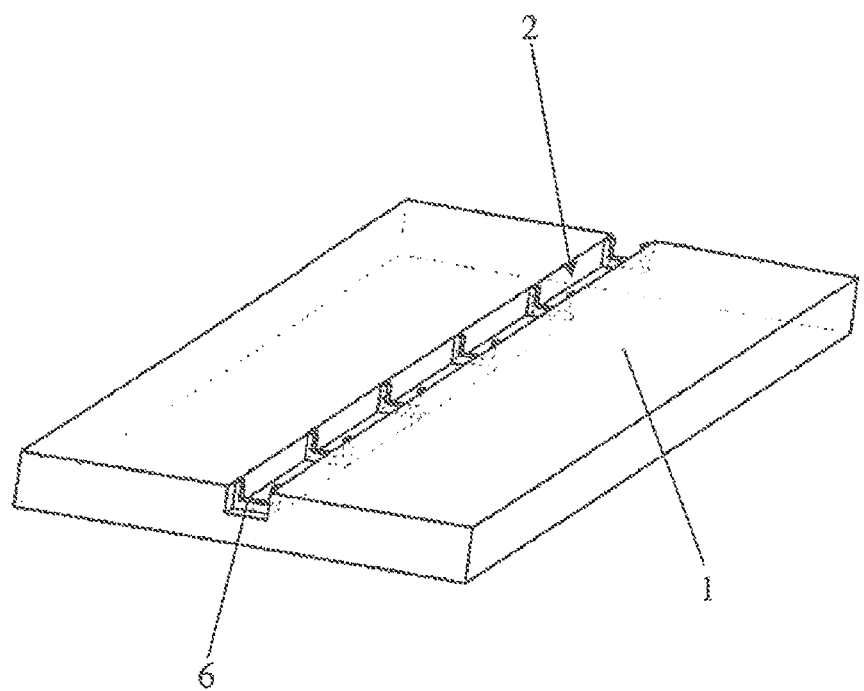
FIG. 1 is a schematic view of the mold according to the disclosed embodiment provided with a fixing support therein.

FIG. 1 is a schematic view of the mold according to the disclosed embodiment. Seen from FIG. 1, the mold 1 comprises a potting groove 2, and fixing supports designed in U-shape supports 6 and made of a flexible material are arranged in the potting groove 2 spaced apart from each other. These U-shape supports 6 are fixedly kept in the potting groove 2, which is realized by a design that the width of the U-shape support 6 is slightly larger than the width of the potting groove 2, and in this situation, as the U-shape support 6 is made of a flexible material, and its elasticity allows the U-shape supports 6 to be clamped in the potting groove, that is, they are clamped in the potting groove in a manner of interference fit, this ensures that the U-shape supports 6 will not move with respect to the mold 1. Also, seen from FIG. 1, the height of the U-shape support 6 is smaller than or equal to the depth of the potting groove 2, so that the U-shape supports 6 will not protrude out from the potting material after the potting material is potted.

Figure 2:
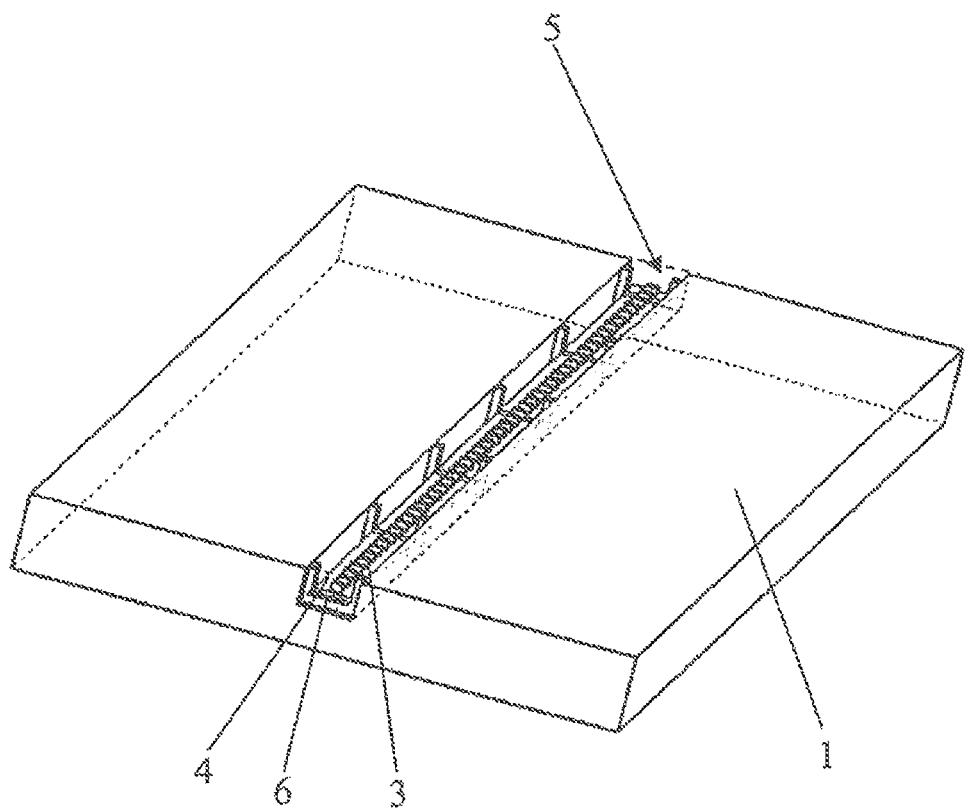
FIG. 2 is a schematic view of the mold according to the disclosed embodiment provided with a fixing support and a printed circuit board therein.

FIG. 2 is a schematic view of the mold according to the disclosed embodiment, and being different from FIG. 1, the U-shape support 6 is provided with a printed circuit board 4, and multiple LED modules as light emitting assemblies 3 are provided on the printed circuit board 4. Seen from FIG. 2, the printed circuit board is fixedly clamped in the U-shape supports 6, which is realized by a design that the width of the opening of the U-shape support 6 is slightly smaller than the width of the printed circuit board 4, and in this situation, the printed circuit board 4 is clamped in the potting groove in a manner of interference fit, this ensures that the printed circuit board 4 will not move with respect to the U-shape supports 6. After arranging the printed circuit board 4, a potting material is potted into the potting groove 2, such as epoxy resin, polyurethane modified epoxy resin and polyurethane resin, and the mold is removed after curing the potting material to obtain a finished lamp chain.

Figure 3:
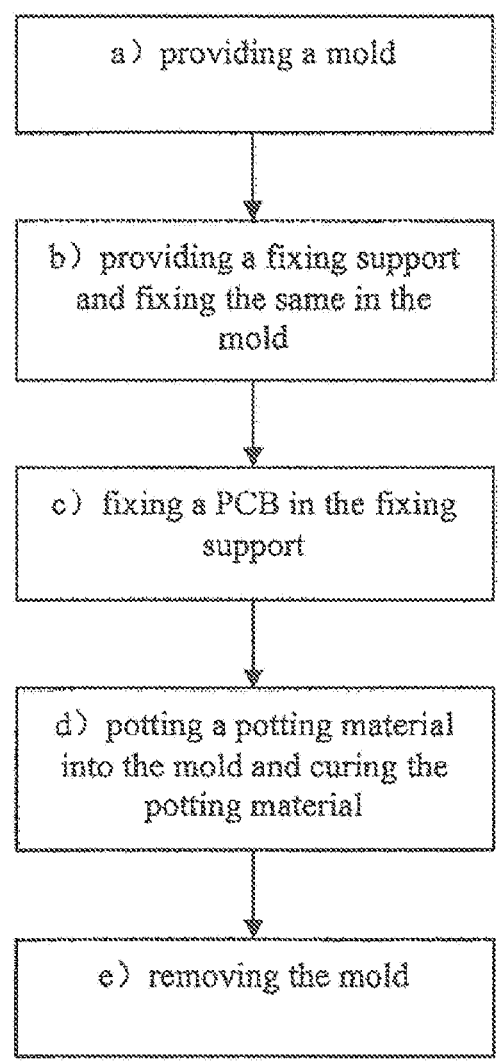
FIG. 3 is flow chart of the potting method according to the disclosed embodiment.

FIG. 3 is a flow chart of the potting method according to various embodiments. In the potting method according to various embodiments, in step a), a mold 1 having a potting groove 2 is provided; in step b), a fixing support is provided, that is, multiple U-shape supports 6, which are fixedly kept in the potting groove 2; in step c), a printed circuit board 4 provided with a light emitting assembly 3 is fixedly kept in the U-shape supports 6; in step d), a potting material 5 is potted into the potting groove 2 and cured; and in step e), the mold 1 is removed to obtain a finished lamp chain.

The descriptions above are only preferable embodiments of the disclosure and are not used to restrict the disclosure. For those skilled in the art, the disclosure may have various changes and variations. Any modifications, equivalent substitutions, improvements etc. within the spirit and principle of the disclosure shall all be included in the scope of protection of the disclosure.

REFERENCE SIGNS

1 Mold
2 Potting groove
3 Light emitting assembly (LED module)
4 Printed circuit board (PCB)
5 Potting material
6 U-shape support

The invention claimed is:

1. A potting method for a lamp chain, the method comprising:
   a) providing a mold having a potting groove;
   b) providing a fixing support which is fixedly kept in the potting groove;
   c) fixedly keeping a printed circuit board provided with a light emitting assembly in the fixing support;
   d) potting a potting material into the potting groove and curing the potting material; and
   e) removing the mold,
   wherein, in a), the potting groove having a U-shape section contour is provided; and in b) the fixing support consisting of multiple U-shape supports spaced apart is provided,
   wherein, in b), the height of the multiple U-shape supports is made to be less than or equal to the depth of the potting groove.

2. The potting method according to claim 1, wherein, in b), the fixing support made of a flexible material is provided.

3. The potting material according to claim 2, wherein, in b), the fixing support made of a material the same as the potting material is provided.

4. The potting method according to claim 1, wherein, in b), the fixing support is clamped in the potting groove.

5. The potting method according to claim 1, wherein, in c), the printed circuit board is clamped in the fixing support.

6. A potting method for a lamp chain, the method comprising:
   a) providing a mold having a potting groove;
   b) providing a fixing support which is fixedly kept in the potting groove;
   c) fixedly keeping a printed circuit board provided with a light emitting assembly in the fixing support;
   d) potting a potting material into the potting groove and curing the potting material; and
   e) removing the mold,
   wherein, in a), the potting groove having a U-shape section contour is provided; and in b) the fixing support consisting of multiple U-shape supports spaced apart is provided,
   wherein, in c), the depth of the opening of the U-shape support is made to be greater than the thickness of the printed circuit board.

7. The potting method according to claim 1, wherein the potting material is epoxy resin, polyurethane modified epoxy resin and polyurethane resin.

8. The potting method according to claim 6, wherein, in b), the fixing support made of a flexible material is provided.

9. The potting material according to claim 7, wherein, in b), the fixing support made of a material the same as the potting material is provided.

10. The potting method according to claim 6, wherein, in b), the fixing support is clamped in the potting groove.

11. The potting method according to claim 6, wherein, in c), the printed circuit board is clamped in the fixing support.

12. The potting method according to claim 6, wherein the potting material is epoxy resin, polyurethane modified epoxy resin and polyurethane resin.

* * * * *